United States Patent
Huang (10) Patent No.: US 8,522,072 B2
(45) Date of Patent: Aug. 27, 2013

(54) MEMORY ADDRESS REMAPPING ARCHITECTURE AND REPAIRING METHOD THEREOF

(75) Inventor: Tsung-Chu Huang, Changhua (TW)

(73) Assignee: National Changhua University of Education, Changhua (TW)

( * ) Notice: Subject to any disclaimer, the term of this patent is extended or adjusted under 35 U.S.C. 154(b) by 215 days.

(21) Appl. No.: 13/267,887

(22) Filed: Oct. 7, 2011

(65) Prior Publication Data

US 2012/0266016 A1    Oct. 18, 2012

(30) Foreign Application Priority Data

Nov. 29, 2010   (TW) .............................. 99141225 A (51) Int. Cl.
   *G06F 11/00*   (2006.01)
(52) U.S. Cl.
   USPC ........................................ 714/6.13; 365/200
(58) Field of Classification Search
   USPC ...................................................... 714/6.13
   See application file for complete search history.

(56) References Cited

U.S. PATENT DOCUMENTS

| | | | |
|---|---|---|---|
| 7,751,264 B1* | 7/2010 | Wu et al. ....................... | 365/200 |
| 7,948,818 B1* | 5/2011 | Wu et al. ....................... | 365/200 |
| 7,984,329 B2* | 7/2011 | Lastras-Montano et al. ............................. | 714/6.13 |
| 8,218,383 B1* | 7/2012 | Wu et al. ....................... | 365/200 |
| 8,289,790 B2* | 10/2012 | Rooney et al. ................ | 365/200 |
| 8,462,569 B1* | 6/2013 | Wu et al. ....................... | 365/200 |
| 2009/0040827 A1* | 2/2009 | Kim ........................ | 365/185.09 |
| 2009/0063896 A1* | 3/2009 | Lastras-Montano et al. ..... | 714/8 |
| 2011/0280091 A1* | 11/2011 | Rooney et al. ................ | 365/200 |

* cited by examiner

*Primary Examiner* — Kamini Patel
(74) *Attorney, Agent, or Firm* — CKC & Partners Co., Ltd.

(57) ABSTRACT

A memory address remapping architecture is applied to execute an address remapping method for repairing a main memory. A valid flag and an essential flag in a TCAM corresponding to at least one subcube address in a spare memory are initialized, and the main memory is checked to find out some faulty cell addresses. The Hamming distance between the subcube address and the faulty cell address is calculated, and the faulty cell address is merged into the subcube address by a masked bits concentrator when the Hamming distance is not larger than an address-width degree of the subcube address and the merged number of the subcube address is not larger than a threshold value.

8 Claims, 9 Drawing Sheets

MEMORY ADDRESS REMAPPING ARCHITECTURE AND REPAIRING METHOD THEREOF

RELATED APPLICATIONS

This application claims priority to Taiwan Patent Application Serial Number 099141225, filed on Nov. 29, 2010. The entire disclosure of the application is hereby incorporated by reference herein.

BACKGROUND

1. Technical Field

The present disclosure relates to the memory repairing technology. More particularly, the present disclosure relates to the memory repairing technology that uses a spare memory to cover the faulty cell addresses in a main memory.

2. Description of Related Art

The International Technology Roadmap for Semiconductors (ITRS) from 2001 to 2007 predicts that the embedded memory will occupy 94% of the entire system memory market before 2014. Although the data is modified at 2009, it is still larger than 87%. In recent years, the production value of the memory occupies more than 30% of the entire production value of the semiconductor chips.

However, since not only the growth of the memory capacity often breaks the Moore's law, but also the variance increases extremely due to the nanotechnology, the yield of the memory without being repaired is lower than 20%. To improve the yield and lower the cost, the memory repairing technology is needed.

The related prior technologies are described as follows.

A conventional memory repairing technology at an early stage is performed using the laser to burn out some preset fuses, and thus a de-multiplexer is controlled to select the word-line of the spare row memory for covering the original word address. The technology needs to design the fuse and to use an extra laser device. Therefore, the technology is not suitable for use in the embedded memory and large capacity memory. In recent years, a iii remapping technology has been applied gradually to replace the conventional memory repairing technology at the early stage.

Figure 1:
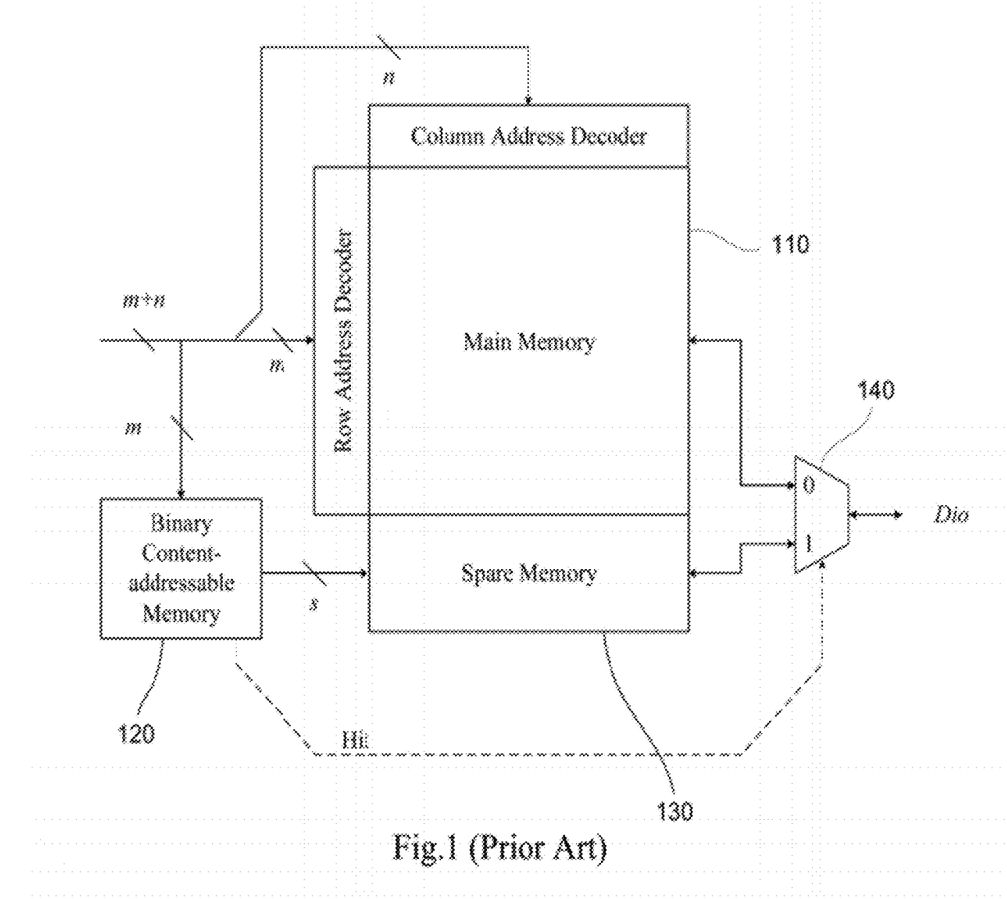
FIG. 1 is a schematic view of a conventional memory address remapping architecture.

Referring to FIG. 1, FIG. 1 is a schematic view of the architecture of a conventional memory address remapping circuit, wherein the conventional memory address remapping circuit is an embedded memory repairing circuit. Besides having a main memory 110 with a column address decoder and a row address decoder, the conventional memory address remapping circuit applies a binary content-addressable memory (BCAM) 120 to compare the faulty cell address of the main memory and the spare memory in parallel. If the address in the spare memory matches (also called hits) the faulty cell address, a priority encoder is applied to select a word line (WL) of the spare memory 130 to replace the accessing of the faulty cell address by controlling a multiplexer 140. The drawback of the technology is low repair rate.

The repairing technologies by using two-dimensional architecture, such as a built-in spare row and column replacement analysis system for embedded memories (U.S. Pat. No. 6,304,989), are focused on improving the repair rate by analyzing the distribution of the faulty cell addressed. In detail, the technology takes the spare row and the spare column into consideration, and thus has better repair rate than the conventional technologies that use one-dimensional architecture. However, the repairing technology performs poorly to deal with the clustered faults. As described above, the growth of the memory capacity and variance makes the two-dimensional architecture also perform poorly.

In Taiwan patent application number 200921690 filed on May 16, 2009, a memory remapping architecture is disclosed to deal with the clustered faults by base address shifting. In detail, the spare memory array provides subarrays in row, column or square shapes to repair the clustered faults. However, the architecture can only deal with array faults on continuous plane, but not to deal with the scattered address fault caused by errors of one or multiple address lines. Therefore, the drawbacks can be listed as follows:

First, the architecture cannot be established in an embedded memory effectively, or else the repair rate is low when applying the algorithm in an embedded memory directly.

Second, the architecture still performs poorly to deal with the scattered faults caused by word line defect.

A paper entitled "Efficient BISR Techniques for Embedded Memories Considering Cluster Faults" is published in the IEEE Transaction on VLSI journal in February 2010. The author takes the cluster faults into consideration, and provides an effective repairing architecture including the divided word line (DWL), the divided bit line (DBL) or both. However, the architecture causes some performance impacts on the memory. On the other hand, the divided spare column and row of the architecture performs poor repair rate to the scattered address faults caused by the address line defects.

SUMMARY

Hence, an aspect of the disclosure is to provide an address remapping method for repairing memory that introduces the hypercube algorithm to achieve high repair rate in the two-dimensional architecture.

According to one embodiment of the disclosure, an address remapping method for repairing memory is provided. The method includes the following steps. In a ternary content-addressable memory, a valid flag and an essential flag corresponding to a subcube address in a spare memory are first initialized. A main memory is checked, and a normal signal is provided when no faulty cell address is detected in the main memory. However, if the faulty address is sent by the memory built-in self test during the test, the faulty address is recovered sequentially. On the other hand, the following steps are executed when at least one faulty cell address is detected in the main memory. First, the faulty cell address is compared with the subcube address and a Hamming distance between them is calculated. Secondly, the spare memory is applied to replace the faulty cell address by merging the faulty cell address into the subcube address when the Hamming distance is not larger than an address-width degree of the subcube address. Third, the value of the subcube address is set constant, and the essential flag is also set when a merged number of the subcube address is larger than a threshold value. Additionally, if no more subcube address is available to cover the faulty Cell address, a failure signal is provided. Otherwise, a next subcube address is triggered and its valid flag is also set to execute the steps above.

Another aspect of the disclosure is to provide a memory address remapping architecture to achieve the address remapping method for repairing memory described above.

According to another embodiment of the disclosure, a memory address remapping architecture includes a ternary content-addressable memory, a masked bits concentrator and a spare memory is disclosed. The ternary content-addressable memory is applied to provide a masked bit based on a self-checking result of a main memory. The masked bits concentrator is applied to access a column address decoder by using the masked bit. The spare memory is controlled by the ternary content-addressable memory and the column address decoder to repair the main memory. Wherein, the ternary content-addressable memory and the masked bits concentrator are applied to execute the address remapping method described above.

Therefore, the embodiments of the disclosure use the hypercube structure to remap the addresses between the main memory and the spare memory. The disclosure not only deals with the row and column faults effectively, but also deals with the cluster faults and the scattered address faults effectively.

DETAILED DESCRIPTION

The disclosure provides a memory address remapping architecture designed by using the hypercube algorithm. The hypercube algorithm applied in repairing memory is introduced as follows.

Figure 2:
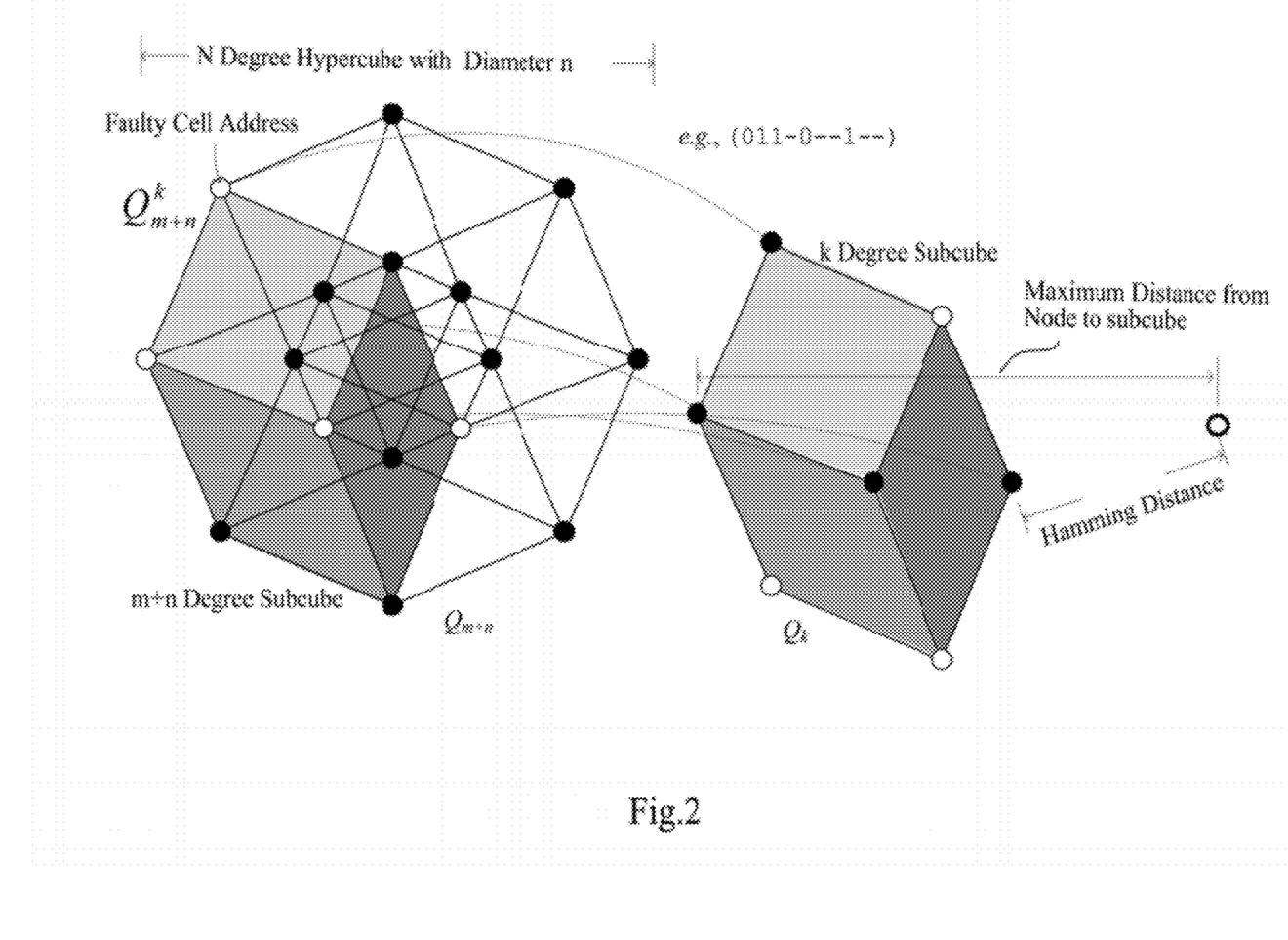
FIG. 2 is a schematic view of the hypercube algorithm applied in the disclosure for repairing memory.

Referring to FIG. 2, FIG. 2 is a schematic view of the hypercube algorithm applied in the disclosure for repairing memory. In FIG. 2, an address is defined by a binary code 2n. A N-degree hyper cube $Q_{2n}{}^n$ is indicated as a ternary address $Q=(Q_{2n-1}, Q_{2n-2}, \ldots Q_n, Q_{n-1}, \ldots, Q_1, Q_0)$, wherein symbol - is applied. In other words, $Q_i$ is composed by one of the three symbols (0, 1, -). The symbol - herewith is a union of 0 and 1, instead of the conventional meaning of "don't care". Additionally, the ternary address Q can also be indicated as a pair of binary value (A, K). Wherein, the masked bit $K_i$ (i=0 . . . 2n−1) is applied to mask the related bits in the address A.

The concept is that when a faulty cell address is matched with the masked address, the masked address is applied to execute the similar function as a "don't care" bit. The address bit that matches the mask will be shifted and merged into a column of a spare memory. Finally, every row address in the spare memory is applied to not only map the row address or column address, but also map the N degree hypercube or any cluster. For instance, a faulty cell address (10110101) is found in a 16×16 main memory, and a corresponding space cube (1 - - 101 - - ) is applied to cover it. Therefore, the masked bits is moved to the address (0101)=5 in the spare memory. Here after the address remapping method for repairing memory specifically by the embodiments is introduced.

Figure 3:
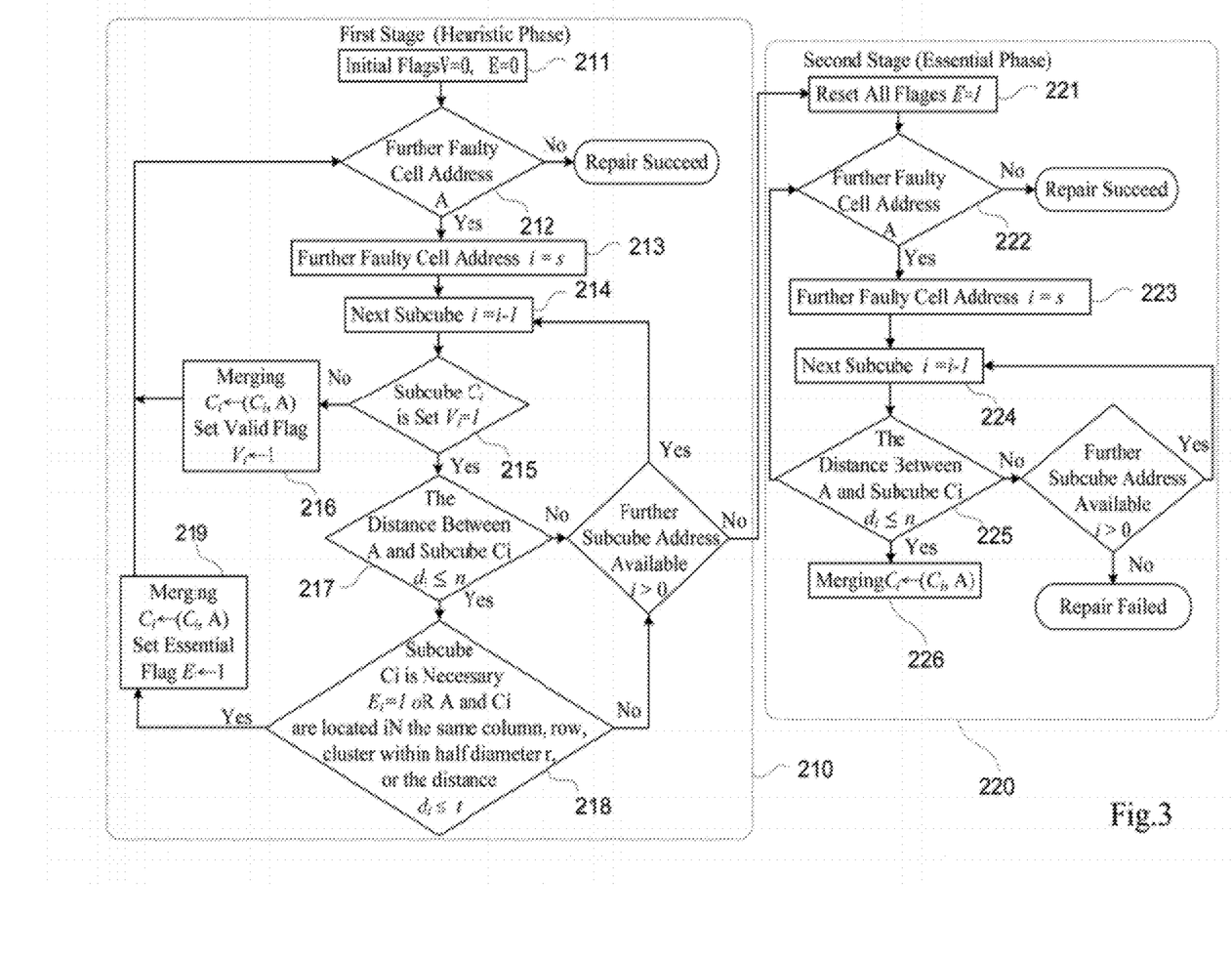
FIG. 3 is a detail step flow chart depicting the address remapping method for repairing memory in one embodiment of the disclosure.

Referring to FIG. 3, FIG. 3 is a detail step flow chart depicting the address remapping method for repairing memory in one embodiment of the disclosure. The operating flow of the address remapping method is explained clearly in FIG. 3 and the following description.

The entire operation can be segmented into the first stage 210 and the second stage 220. In the first stage 210, as shown in step 211, the valid bit V which is shared by the TCAM and the self repairing mechanism is set to be 0. V is the valid flag for TCAM, and V is also the initial flag for self repairing mechanism. The essential bits, i.e. the essential flag, E is also set to be 0, and thus the first stage 210 is applied to be a loop for receiving and dealing every faulty cell address A.

And then, as shown in step 212, a testing module is applied to check whether a faulty cell address exists in the main memory or not. If the testing result shows no faulty cell address, the degree of the spare subcube is expended to n, i.e. the entire row address-width. A repaired successful report is provided thereby.

On the other hand, under the appearance of any faulty cell address shown in the testing result, the loop of each subcube is rechecked as follows. First, as shown in step 213, the index i of the spare subcube is reset to be the number of the spare subcubes. As shown in step 214, the index i decrease 1 when a next subcube is accessed. As shown in step 215, the valid flag $V_i$ is checked. If the valid flag $V_i$ is not initialed yet, as shown in step 216, and the faulty cell address A is stored in the $C_i$ and the valid flag $V_i$ is initialed. On the other hand, if the valid flag $V_i$ has been initialed, as shown in step 217, the Hamming distance between the faulty cell address A and the subcube $C_i$ is calculated. And then, as shown in step 218, the following conditions are considered.

First condition, the spare subcube has been marked as essential, i.e. $E_i=1$. The faulty cell address A can be merged into the spare subcube $C_i$.

Second condition, the faulty cell address A and the spare subcube $C_i$ are located at the same row. The faulty cell address A can be merged into the spare subcube $C_i$ and marked as essential.

Third condition, the faulty cell address A and the spare subcube $C_i$ are located at the same column. The faulty cell address A can be merged into the spare subcube $C_i$ and marked as essential.

Fourth condition, the faulty cell address A and the spare subcube $C_i$ are located in a cluster with half diameter r. The faulty cell address A can be merged into the spare subcube $C_i$ and marked as essential.

Fifth condition, the maximum Hamming distance between the faulty cell address A and the spare subcube $C_i$ is not longer than a threshold distance t.

Finally, as shown in step 219, the faulty cell address A and the spare subcube $C_i$ are merged if one of the five conditions is matched. However, if they are not merged, a next spare subcube is selected to cover the faulty cell address A by reworking the steps described above. The entire mechanism enters to the second stage 220 when there is no available spare subcube for repairing. A repairing failed report is provided when the second stage 220 also cannot provide anymore spare subcube. The steps 221-226 in the second stage 220 can be understood by the above description and FIG. 3.

Figure 4:
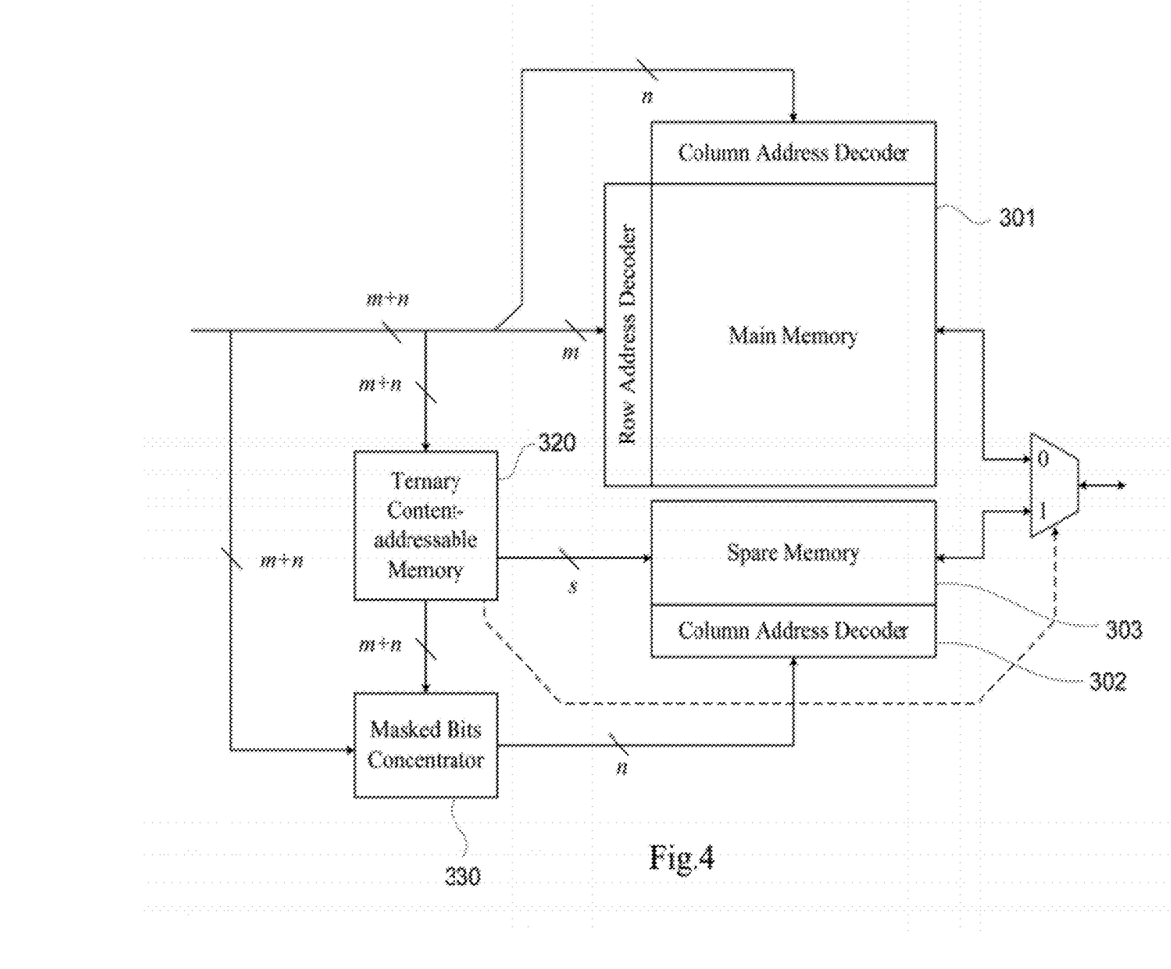
FIG. 4 is a schematic view of the memory address remapping architecture in another embodiment of the disclosure.

Referring to FIG. 4, FIG. 4 is a schematic view of the memory address remapping architecture in another embodiment of the disclosure. Majorly, the memory address remapping architecture combines a traditional self-detect circuit with a novel ternary content-address memory (TCAM) 320 and a novel masked bits concentrator 330. The self-detect circuit is applied to check a main memory array 301 and thus to find out at least one faulty cell address. The masked bits concentrator 330 is arranged between the ternary content-address memory (TCAM) 320 and an address decoder 302. The masked bits concentrator 330 is applied to decide a particular location in the address decoder 302, and the ternary mask address is written to the particular location. The TCAM 320 and the masked bits concentrator 330 are applied to execute the address remapping method described above based on the faulty cell address. Therefore, at least one ternary mask address is written into the address decoder 302, and thus a spare memory 303 is applied to cover the faulty area of the main memory 301. The detailed operation of the memory address remapping architecture in FIG. 4 is described as follows.

Figure 5:
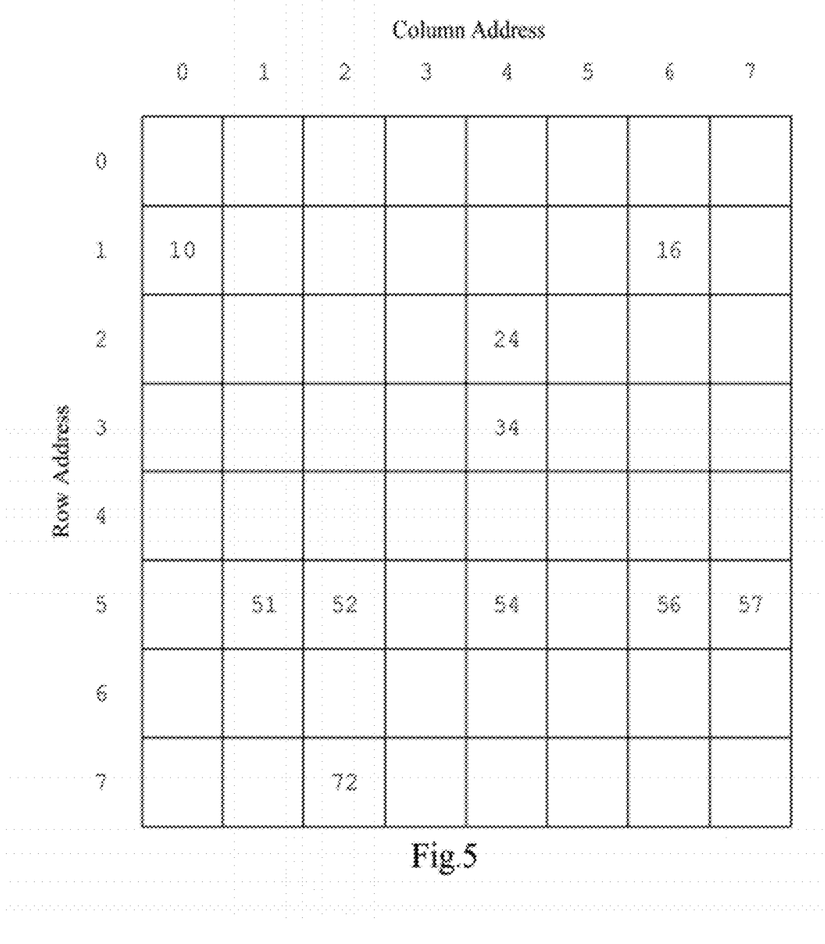
FIG. 5 is a sample depicting the remapping condition achieved by the method in FIG. 3.
Figure 6:
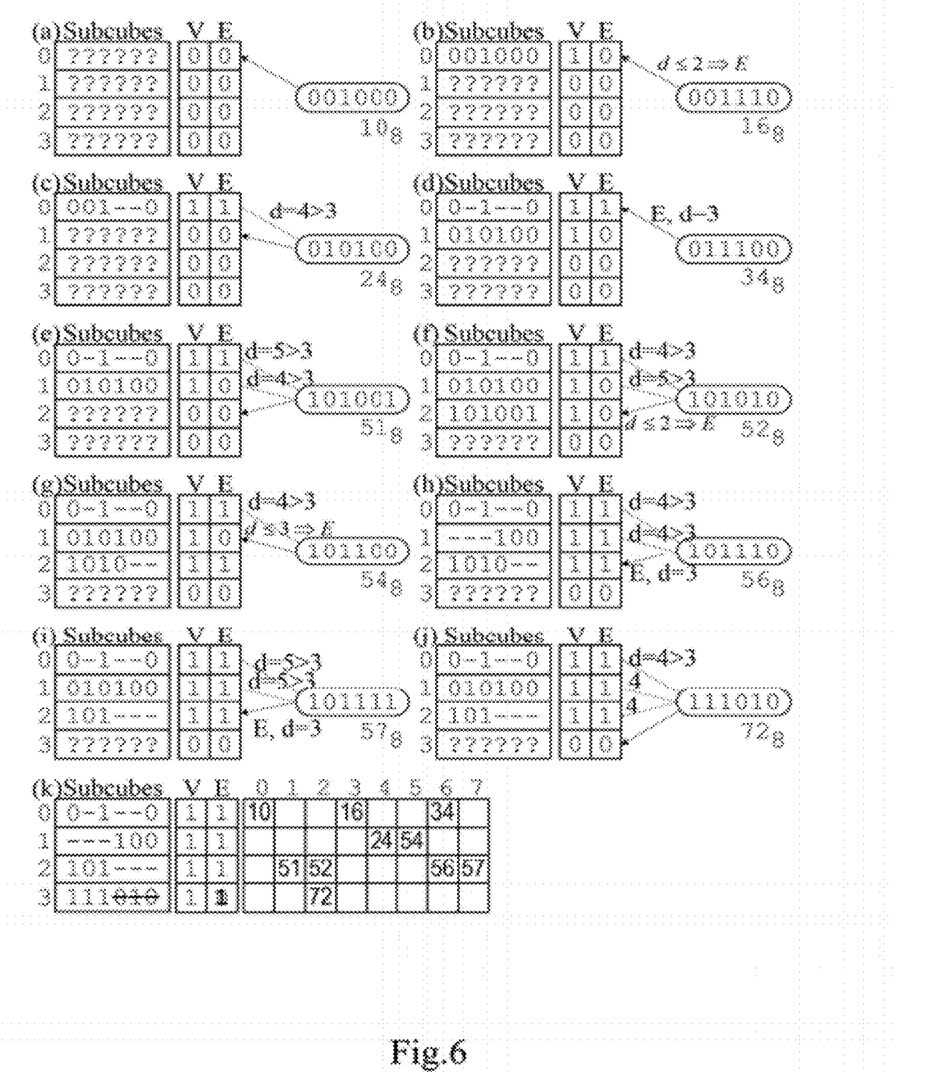
FIG. 6 is a sample depicting the operating steps achieved by the method in FIG. 3.

Referring to FIG. 5 and FIG. 6, FIG. 5 is a sample depicting the remapping condition achieved by the method in FIG. 3, and FIG. 6 is a sample depicting the operating steps achieved by the method in FIG. 3. Taking an 8×8 main memory for instance, each row address from 0 to 7 are marked as 0(Decimal)=$(000)_2$(Binary) to 7=$(111)_2$, and each column address from 0 to 7 are also marked as 0(Decimal)=$(000)_2$(Binary) to 7=$(111)_2$. The row address is marked front the column address. Therefore, the first faulty cell address is marked as $(001000)_2=10_8$(Octal), and the second faulty cell address is marked as $(001110)=16_8$, which means that the faulty area is located at cross point of the first row and the sixth column, wherein the array is started from the row 0 and the column 0. Similarly, the third faulty cell address is marked as $(010100)_2=24_8$, and others are shown as in FIG. 5 and FIG. 6.

In the address remapping method of the embodiment, as shown in FIG. 3 and further referring to FIG. 6($a$) and FIG. 6($b$), the valid flag V and the essential flag E are initialed to be 0. The first faulty cell address $(001000)_2=10_8$ is inserted into the address decoder of the spare memory. Since the first column of the address decoder has been written, the corresponding valid flag V is set to be 1. And then, the second faulty cell address $(001110)_2=16_8$ is compared with the first faulty cell address $(001000)_2=10_8$ before being written into the address decoder. The Hamming distance between them is d=2, wherein the way to calculate the Hamming distance is to count the number of the different bits between them. Since the address number of the row and the column is 8, i.e. $2^3$, the threshold value of the embodiment is 3 (so called preset value). As shown in FIG. 6($c$), since the Hamming distance of the first and second faulty cell address is smaller than the threshold value, d<3, they are merged to be a ternary mask address (001 - - 0). The ternary mask address (001 - - 0) is written into the first column of the address decoder, and the essential flag E is set to be 1.

And then, when a third faulty cell address $(010100)_2=24_8$ is applied to be written into the address decoder, as shown in FIGS. 6 ($c$) and ($d$), the Hamming distance between the third faulty cell address $(010100)_2=24_8$ and the ternary mask address (001 - - 0) is counted. Since the Hamming distance is larger than the threshold value, i.e. d=4>3, the third faulty cell address $(010100)_2=24_8$ can only be written into the second column of the address decoder. In other words, the third faulty cell address cannot share the same column with the first and the second faulty cell address, and it also means that the first column of the decoder cannot cover the third faulty cell address. And then, a fourth faulty cell address $(011100)_2=34_8$ is applied to be written into the address decoder. It is compared with the ternary mask address (001 - - 0) in the first column of the address decoder. Since the Hamming distance between them is not larger than the preset value, i.e. d=3, the ternary mask address (001 - - 0) is reset to be (0 - 1 - - 0) and thus the fourth faulty cell address $(011100)_2=34_8$ is merged into the first column of the address decoder.

Similarly, as shown in FIG. 6 ($e$), the fifth faulty cell address $(101001)_2=51_8$ is applied to be written into the address decoder. It is compared with the ternary mask addresses in the first and second column of the address decoder in sequence. If the ternary mask address is reset after comparing, the essential flag is set to be 1. Otherwise, only the valid flag V is reset to be 1 after the corresponding column in the address decoder is accessed. Therefore, as being described above, the faulty cell addresses in FIG. 5 are remapped into the spare memory which is much smaller than usual in the smart way.

Figure 7:
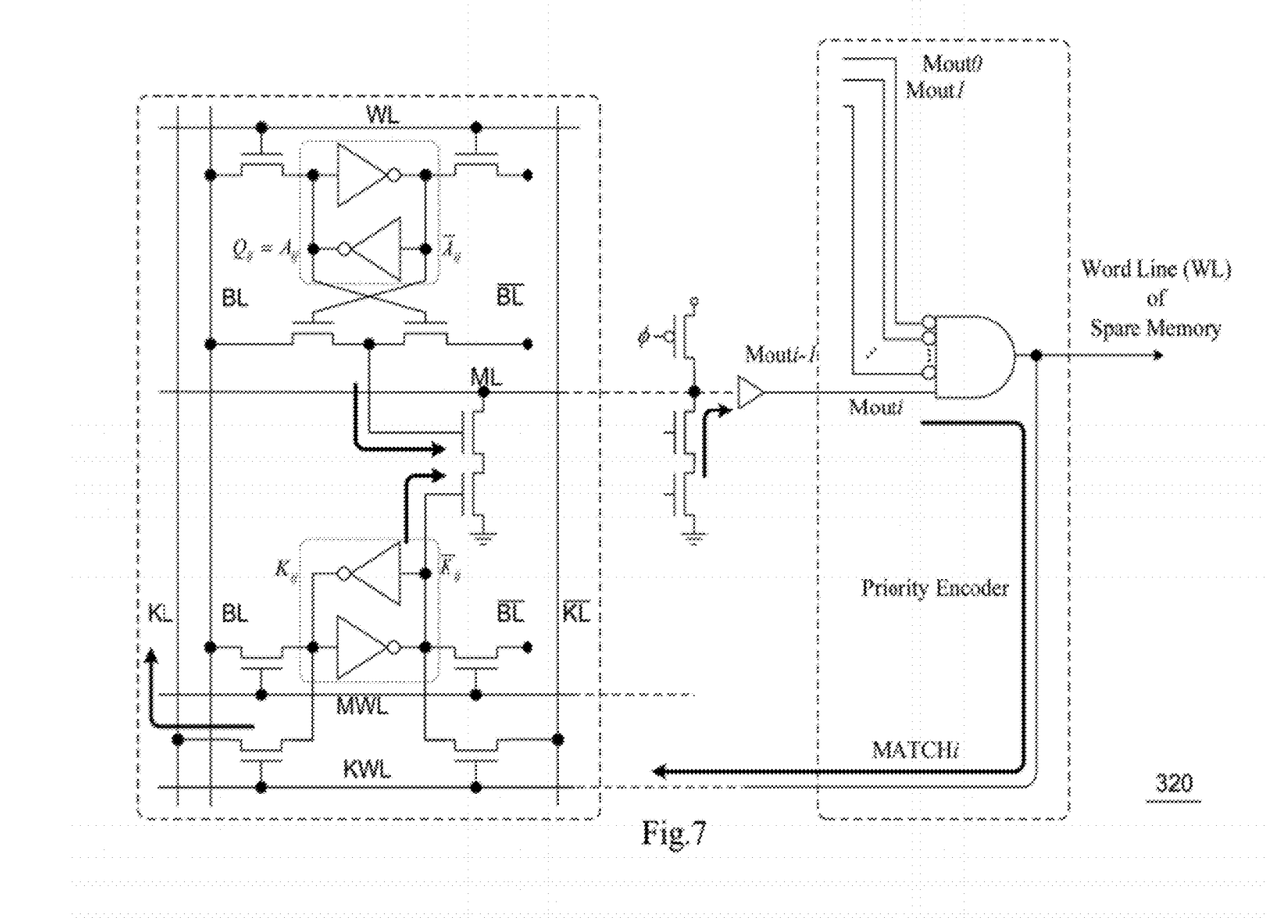
FIG. 7 is a schematic view of the ternary content-addressable memory 320 and its peripheral circuit in FIG. 4.

Additionally, the circuits of the TCAM 320 and the address decoder 302 can be achieved as shown in FIG. 7. FIG. 7 is a schematic view of the ternary content-addressable memory 320 and its peripheral circuit in FIG. 4. In FIG. 7, one unit of the TCAM 320 is composed by the traditional mask type TCAM and a pair of mask read line. The mask read line is applied to inform the masked bits concentrator about the removed address bits. For the masked bits concentrator, there are n bits in the (m+n) bits to be 1. The masked bits concentrator is applied to move out the n corresponding bits from the (m+n) bits, and thus to provide a mapping hypercube address. The sequences of the faulty cell addresses and the spare subcubes are not necessarily to be the same, but they have to be mapped to each other one by one.

Figure 8:
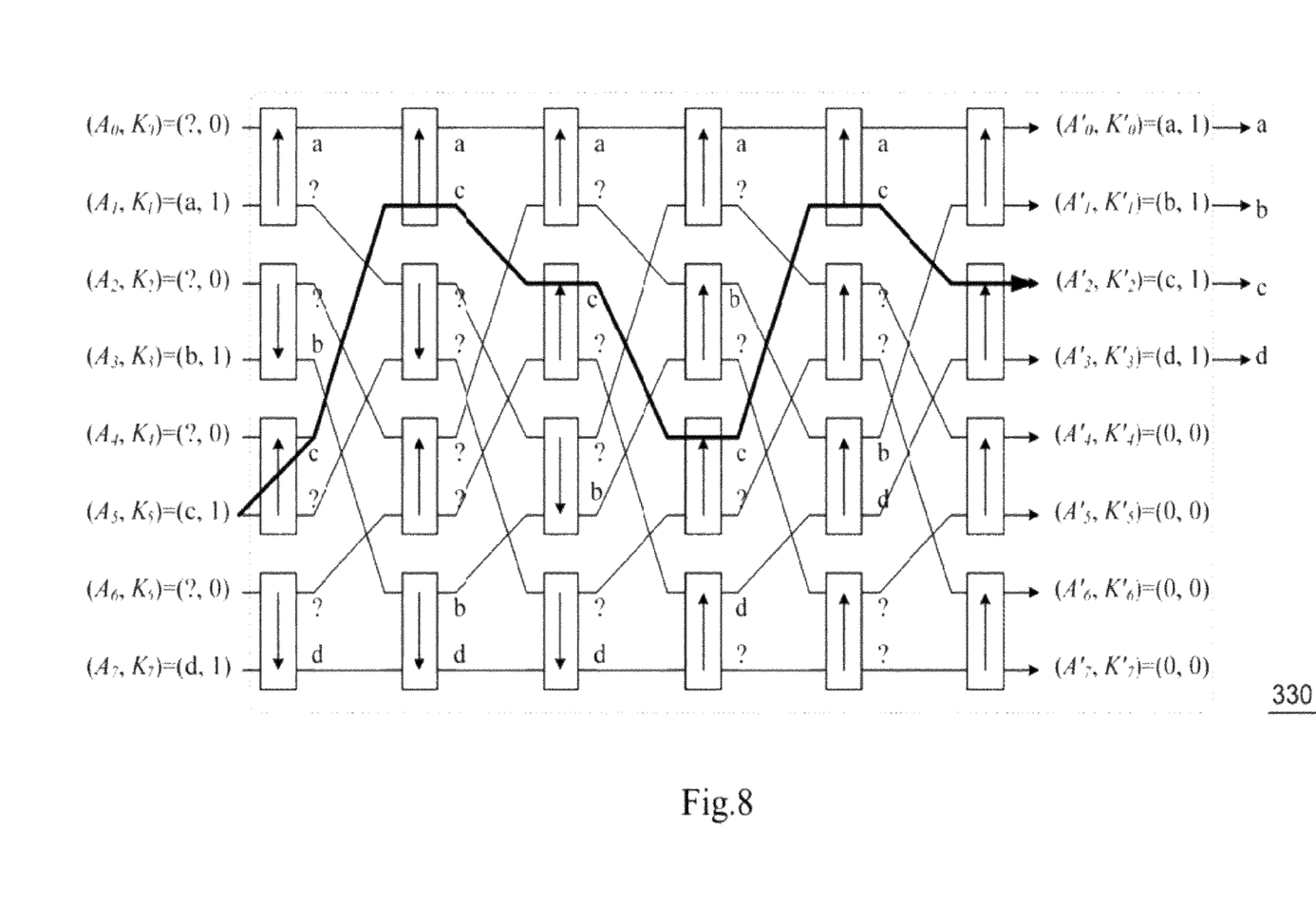
FIG. 8 is a schematic view of the masked bits concentrator 330 in FIG. 4, wherein the masked bits concentrator 330 is achieved by a parallel sorter.
Figure 9:
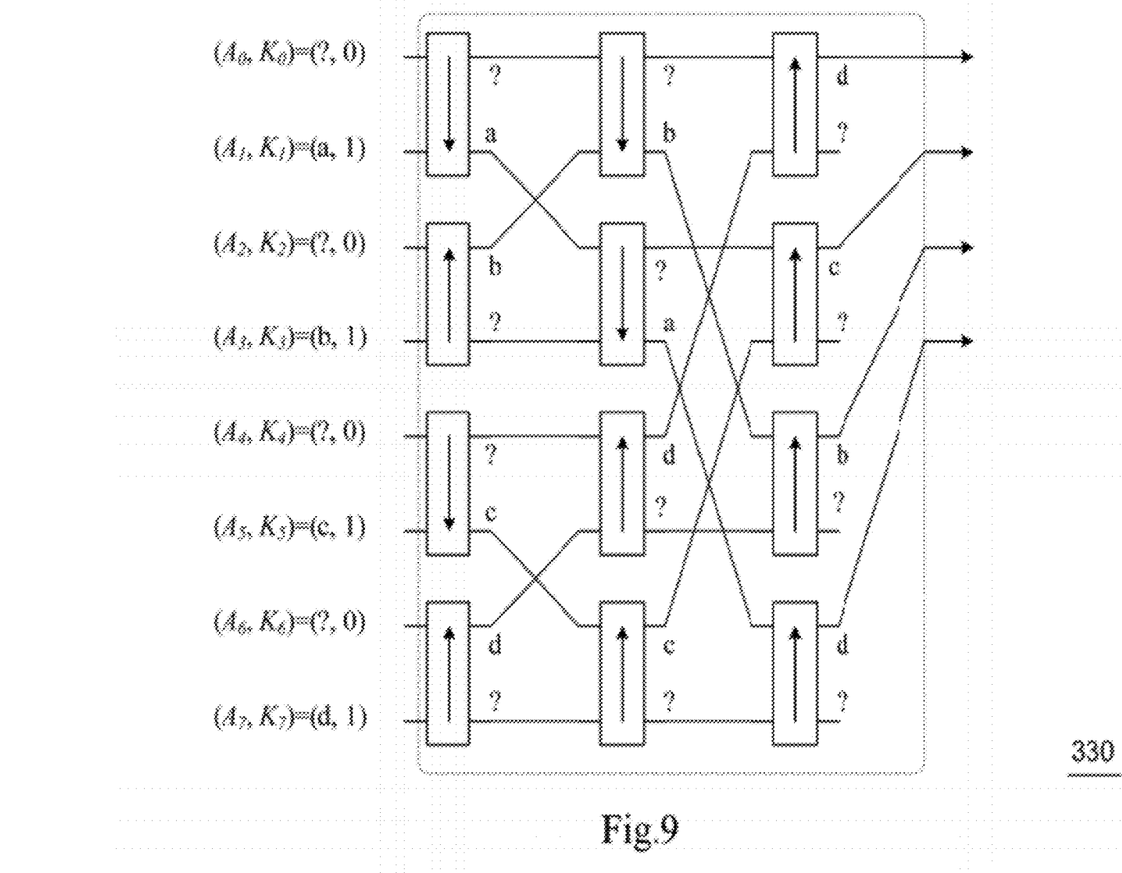
FIG. 9 is a schematic view of the masked bits concentrator 330 in FIG. 4, wherein the masked bits concentrator 330 is achieved by a bitonic sorter.

Referring to FIG. 8 and FIG. 9, FIG. 8 is a schematic view of the masked bits concentrator 330 in FIG. 4, wherein the masked bits concentrator 330 is achieved by a parallel sorter to map the addresses of the ternary content-addressable memory to the subcube addresses of the spare memory in sequence. In FIG. 8, the masked bits concentrator 330 achieved by the parallel sorter is designed to be a 4/8 (4 out of 8) concentrator composed by eight binary parallel sorters under m=n=4. The sequences of the faulty cell addresses and the spare subcubes are the same. The (m+n) bits parallel sorter requires $\lceil \log_2(m+n) \rceil (\lceil \log_2(m+n) \rceil -1)/2$ degrees, i.e. (m+n)$\lceil \log_2(m+n) \rceil (\lceil \log_2(m+n) \rceil -1)/4$ swappers.

FIG. 9 is a schematic view of the masked bits concentrator 330 in FIG. 4, wherein the masked bits concentrator 330 is achieved by a bitonic sorter to map the addresses of the ternary content-addressable memory to the subcube addresses of the spare memory by injection. In FIG. 9, the masked bits concentrator 330 achieved by the bitonic sorter is designed to be a 4/8 (4 out of 8) concentrator composed by eight binary bitonic sorters under m=n=4. The (m+n) bits bitonic sorter requires only $\lceil \log_2(m+n) \rceil$ degrees, i.e. (m+n)$\lceil \log_2(m+n) \rceil /2$ swappers. Although the sequences of the faulty cell addresses and the spare subcubes are not the same, they still work correctly due to their one by one injection.

As described above, the embodiments use an (m+n) degree hypercube to cover a memory array with M×N units (M=$2^m$, N=$2^n$). In other words, a spare row can be regarded as any n degree subcube in an (m+n) degree two-dimensional space based on the embodiments. It is suitable to repair the faulty cell addresses distributed as a column, a row, a cluster or scattered as a subcube. Therefore, the embodiments improve the repair rate and can be achieved in a small area, and thus the yield is increased and the cost is down.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An address remapping method for repairing memory, comprising:
    initializing a valid flag and an essential flag in a ternary content-addressable memory, the valid flag and the essential flag correspond to a subcube address in a spare memory;
    checking a main memory and providing a normal signal when no faulty cell address is detected in the main memory;
    executing a repairing step when at least one faulty cell address is detected in the main memory, the repairing step comprises:
        comparing the faulty cell address with the subcube address and calculating a Hamming distance between them;
        using the spare memory to replace the faulty cell address by merging the faulty cell address into the subcube address when the Hamming distance is not larger than an address-width degree of the subcube address; and
        setting the value of the subcube address and setting the essential flag when a merged number of the subcube address is larger than a threshold value;
    providing a failure signal when no more subcube address is available to cover the faulty cell address; and
    triggering a next subcube address by setting a next valid flag.

2. The address remapping method for repairing memory of claim 1, wherein the subcube address is applied to cover several faulty cell addresses distributed as a column.

3. The address remapping method for repairing memory of claim 1, wherein the subcube address is applied to cover several faulty cell addresses distributed as a row.

4. The address remapping method for repairing memory of claim 1, wherein the subcube address is applied to cover several faulty cell addresses distributed as a cluster.

5. The address remapping method for repairing memory of claim 1, wherein the subcube address is applied to cover several faulty cell addresses distributed as a subcube.

6. A memory address remapping architecture, comprising:
    a ternary content-addressable memory for providing a masked bit based on a self-checking result of a main memory;
    a masked bits concentrator for accessing a column address decoder by using the masked bit; and
    a spare memory controlled by the ternary content-addressable memory and the column address decoder for repairing the main memory;
    wherein, the ternary content-addressable memory and the masked bits concentrator are applied to execute the address remapping method for repairing memory of claim 1.

7. The memory address remapping architecture of claim 6, wherein the masked bits concentrator is a parallel sorter for mapping the addresses of the ternary content-addressable memory to the subcube addresses of the spare memory in sequence.

8. The memory address remapping architecture of claim 6, wherein the masked bits concentrator is a bitonic sorter for mapping the addresses of the ternary content-addressable memory to the subcube addresses of the spare memory by injection.

* * * * *